United States Patent [19]

Black et al.

[11] Patent Number: 4,624,749

[45] Date of Patent: Nov. 25, 1986

[54] ELECTRODEPOSITION OF SUBMICROMETER METALLIC INTERCONNECT FOR INTEGRATED CIRCUITS

[75] Inventors: Jimmy C. Black; Bruce E. Roberts, both of Palm Bay; Dyer A. Matlock, Melbourne, all of Fla.

[73] Assignee: Harris Corporation, Melbourne, Fla.

[21] Appl. No.: 771,712

[22] Filed: Sep. 3, 1985

[51] Int. Cl.$^4$ .............................................. C25D 5/02
[52] U.S. Cl. ...................................................... 204/15
[58] Field of Search .................................. 204/15, 38.4

[56] References Cited

U.S. PATENT DOCUMENTS 4,255,481  3/1981  Dinella ............................... 204/38.4
4,514,265  4/1985  Rao ........................................ 204/15

Primary Examiner—T. M. Tufariello
Attorney, Agent, or Firm—Antonelli, Terry & Wands

[57] ABSTRACT

Formation of a metallic interconnect pattern in submicron geometry architectures, without the photoresist being lifted off the substrate and resulting in the deposited metal being electroplated therebeneath, is achieved by a combination of a toughened-skin photoresist and pulsed electroplating. For toughening the skin of the photoresist and thereby enhancing its ability to withstand encroachment of the electrodeposited metal, the photoresist layer is illuminated with ultraviolet radiation. After the UV-irradiated photoresist has been allowed to cool, the resulting structure is placed in an electroplating bath, with appropriate electrodes disposed in the bath and connected to a said layer on the wafer for the deposition of the interconnect metal. The electrode differential is pulsed to provide a low frequency plating current through which the conductor metal is plated onto the seed metal on the wafer, as defined by the pattern of the toughened photoresist. After a prescribed, controlled electrodeposition interval during which the interconnect conductor has been plated to a desired level by the pulsed electroplating current, the wafer is removed from the bath and the photoresist layer is etched off, to leave only the electrodeposited interconnect layer and the underlying base (seed) metal. The exposed base metal is then etched leaving only the desired electrodeposited interconnect pattern.

20 Claims, 6 Drawing Figures

ELECTRODEPOSITION OF SUBMICROMETER METALLIC INTERCONNECT FOR INTEGRATED CIRCUITS

FIELD OF THE INVENTION

The present invention relates in general to semiconductor devices and is particularly directed to a technique for electrodepositing metallic interconnects on a large scale integrated circuit.

BACKGROUND OF THE INVENTION

Electrodeposition has enjoyed wide use by semiconductor process engineers for the formation of metallic interconnect structures through which elements of an integrated circuit architecture are connected to each other and to external terminal pads. As the geometries of these architectures continue to decrease, however, (e.g. for line widths in the submicron range) conventional electrodeposition methodologies have been found to be inadequate to prevent the encroachment of deposited metal beneath the edges of the photoresist through which the interconnect metallization is patterned. More particularly, during electrodeposition, the deposited metal, in addition to growing vertically, also tries to grow horizontally; the metallization mask (photoresist) serves to inhibit side or horizontal growth but to permit vertical growth (deposition) in the mask apertures. As line widths become narrower, however, the lateral growth action of the metal against the sides of the photoresist may actually lead to a lifting-off of the photoresist from the underlying base layer, resulting in an underplating of resist-covered areas and consequential electrical shorts.

SUMMARY OF THE INVENTION

In accordance with the present invention, the inability of conventional metal electrodeposition methodologies to faithfully form a metallic interconnect pattern in submicron geometry architectures, without the photoresist being lifted off the substrate and resulting in the deposited metal being electroplated therebeneath, is overcome by a technique that employs the combination of a toughened-skin photoresist and pulsed electroplating. For toughening the skin of the photoresist and thereby enhancing its ability to withstand encroachment of the electrodeposited metal, the photoresist layer is illuminated with an ultraviolet lamp, as the temperature of a chuck on which the substrate is mounted is ramped to within 10° C. of 200° C. After the UV-irradiated photoresist has been allowed to cool, the resulting structure is placed in an electroplating bath, with appropriate electrodes disposed in the bath and connected to the layer on the wafer for the deposition of the interconnect metal. The electrode potential is pulsed (ON-OFF MODULATED) to provide a low frequency plating current through which the conductor metal is plated onto the seed metal on the wafer, as defined by the pattern of the toughened photoresist. After a prescribed, controlled electrodeposition interval during which the interconnect conductor has been plated to a desired level by the pulsed electroplating current, the wafer is removed from the bath and the photoresist layer is etched off, to leave only the electrodeposited interconnect layer and the underlying base (seed) metal. The exposed base metal is then etched leaving only the desired electrodeposited interconnect pattern.

DETAILED DESCRIPTION

Figure 1:
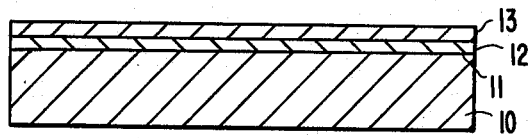
FIGS. 1–6 are diagrammatic illustrations of an integrated circuit structure in the course of the electrodeposition of interconnect metal in accordance with the present invention.
Figure 2:
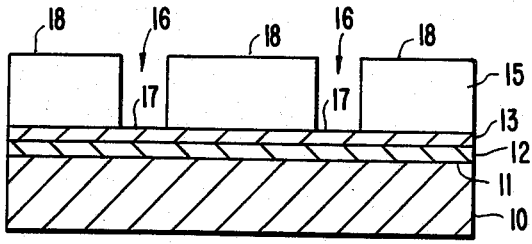

Referring now to FIG. 1, there is shown a diagrammatic cross-sectional illustration of a portion of an integrated circuit structure upon which a metallic interconnect conductor layer is to be formed. For purposes of the present description it will be assumed that the interconnect pattern of interest is a first level of interconnect to be selectively deposited on the surface of a semiconductor (e.g. silicon or gallium arsenide) wafer 10 which contains a plurality of regions, prescribed ones of which are to be selectively connected to the first layer of interconnect. It will also be assumed that gold is the interconnect metal to be electrodeposited, gold being selected as a preferred metal because of its superior signal conducting properties and its immunity to electromigration. It should be understood, however, that the invention is not limited to the electrodeposition of gold or any other specific metal. Gold is chosen as a preferred metal because of its desirable electronic properties, as noted above. It should also be understood that the electrodeposition process of the present invention is not limited to the formation of a layer of interconnect on a specific surface, such as a silicon or gallium arsenide wafer, per se, or an overlying insulator, such as a layer of silicon dioxide, but is applicable to any device configuration upon the surface of which formation of a metallic layer is required.

With reference again to FIG. 1, on the top surface 11 of a semiconductor substrate 10, a seed or base layer for promoting the electrodeposition of the conductor metal of the interconnect is formed. For this purpose the substrate may be placed in a vacuum deposition system and the seed layer deposited directly thereon. For present day integrated circuit structures, such as where the substrate contains silicon (such as a silicon wafer or an overlying layer of silicon dioxide (as in a multilevel interconnect structure)) and where gold, for example, is employed as the interconnect metal, an adhesive and diffusion barrier layer 12 is preferably formed on the surface 11 of substrate 10, to ensure bonding of the (gold) seed layer to the substrate. For gold/silicon or gold/silicon dioxide structures, the adhesive/diffusion barrier layer preferably comprises a thin film of titanium and/or certain titanium compounds which exhibits superior adhesive properties for bonding gold to silicon. Following formation of the adhesive/diffusion barrier layer 12, a gold seed layer 13 is deposited to a thickness of 500–1,000 Å on the adhesive/diffusion barrier layer 12, to provide a base onto which gold is to be deposited from an electroplating bath.

Next, as shown in FIG. 1, a layer of patterned photoresist 15 having apertures 16 therethrough, exposing selected portions of the seed layer 13, is formed on the seed layer 13. For this purpose, following deposition of the seed layer 13, the structure of FIG. 1 may be subjected to a dehydration thermal treatment and/or a photoresist adhesion promoter may be applied over the surface of seed layer 13. However these preliminary photoresist preparation steps are not critical and may be dispensed with if desired. The photoresist may be applied by spin coating the structure and thereafter subjecting the applied material to a low temperature heat treatment to secure the resist, followed by photolithographic alignment, exposure and development of the resist layer 15, so as to leave surface regions 17 of seed metal layer 13, exposed by apertures 16 in the developed resist 15, upon which surface regions 17 interconnect metal (e.g. gold) is to be electrodeposited.

Figure 3:
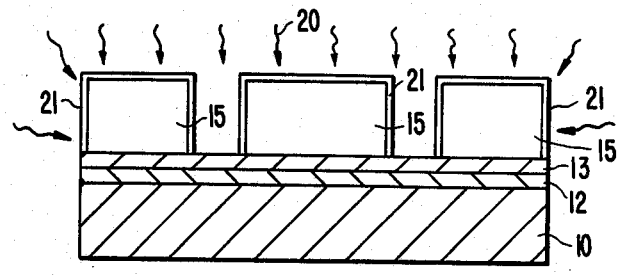

Before electrodeposition can proceed, it is necessary to "toughen" the surface 18 of the photoresist layer 15, so as to assist in the prevention of "side flow" of the photoresist and the above-mentioned undesirable lift-off phenomenon. For this purpose, the wafer is loaded onto a heated vacuum chuck (initial temperature less than 100° C.), which is positioned to expose the wafer to a controlled source of ultraviolet radiation. Such a source may comprise the ultraviolet lamp of an ultraviolet curing apparatus, such as one provided by Fusion Systems Inc., which is energized for a prescribed illumination (curing) interval (e.g. one minute) during which time the temperature of the chuck on which the substrate is mounted is ramped up to a prescribed temperature, e.g. to within 10° C. of 200° C. This illumination of the surface 18 of the patterned photoresist 15 is illustrated in FIG. 3 by ultraviolet rays 20, through which the outer surface, or skin, 21 of the photoresist 15 is toughened, resulting in a photoresist pattern that is considerably more rigid and resistant to side-flow and lift-off during electroplating than without such "skin toughening". After exposure to the ultraviolet rays, the wafer is allowed to cool on the chuck before being removed from the UV curing apparatus. The wafer is now ready for electroplating of the interconnect metal.

Figure 4:
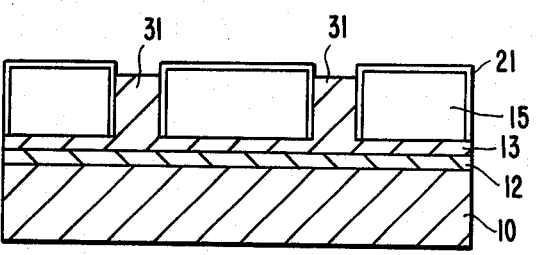

Prior to immersion in an electroplating bath, the wafer is affixed to a suitable wafer mounting assembly (not shown) with contact terminals attached to the seed metal layer that is to act as the cathode of the plating solution. The assembly is then submerged in an electroplating solution and a metal anode (solid or mesh) larger in area than that of the wafer is placed in the bath. A pulsed current supply is connected to external leads that are coupled to the anode and cathode terminals of the plating vessel. The output of the pulsed current supply is on-off modulated, or pulsed, in accordance with a prescribed timing pattern to define the durations of the respective potentials at which the plating electrodes are set. For this purpose, the electroplating potentials are controlled by potentiometers and associated timer controlled switches, that effectively cause the electroplating power supply output to be on-off modulated at a prescribed frequency and duty cycle for an interval of time sufficient to plate the interconnect metal to a desired height within the pattern defined by the photoresist, as shown at 31 in FIG. 4.

For electroplating gold, employing a commercially available electroplating solution such as Pur-A-Gold 401 supplied by Sel-Rex Corporation, it has been found that the frequency of the pulsed electroplating current should lie in a range of from 100 Hz to 1,000 Hz. Within this range, it has been found that the gold electroplate affects the resist adhesion to a minimal degree at an optimum frequency of 250 Hz.

While the physical/chemical impact of the modulation or pulsing of the electroplating current supply on the photoresist is not completely understood, it is believed that the off-period of each duty cycle of the pulsed electroplating current permits gaseous products that are generated during the on-period of the duty cycle to effectively disperse, thereby preserving the surface of the photoresist in its intended pattern defining quality, without having a tendency to lift-off the seed layer.

Figure 5:
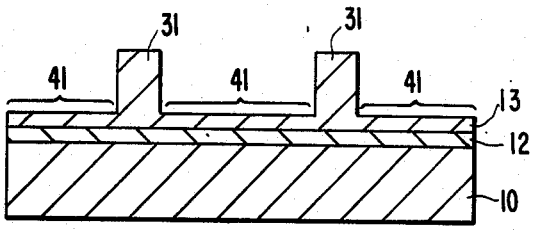
Figure 6:
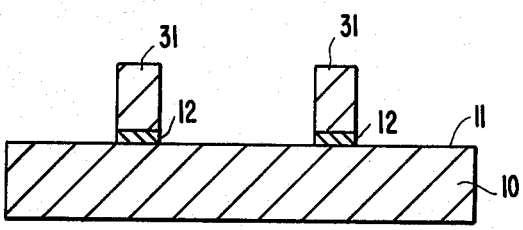

When the interconnect metal has been electrodeposited to the desired level, the wafer is removed from the bath and the photoresist layer is stripped off, such as by chemical plasma etch, to leave only the selectively deposited metal (gold) layer 31 overlying the seed layer 13, exposing areas 41 of the seed layer, as shown in FIG. 5. Then the seed layer 13 and its underlying adhesive film 12 are removed at areas 41 between the electrodeposited gold pattern 31, as by chemical or reactive ion etching, thereby leaving a patterned device structure as shown in FIG. 6. Namely, the substrate is now left with the intended free standing metallization pattern that faithfully conforms to the areas outlined by the original photoresist.

As will be appreciated from the foregoing description, the electrodeposition metallization process of the present invention provides a technique for forming patterned interconnects for an integrated circuit that effectively prevents the pattern-defining material (photoresist) from being subjected to separation or lift-off from the underlying base layer and thereby avoids electrical shorts due to underplating beneath the photoresist. By a combination of photoresist skin toughening, through ultraviolet radiation, and pulsing or modulation of the electroplating current supply, the photoresist is able to resist peeling/underplating, and thereby provide a mask pattern that maintains the intended metallization profile at the completion of the electrodeposition process.

While we have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A method of forming a metallization pattern on the surface of a support structure comprising the steps of:
    (a) selectively forming a metallization mask over the surface of said support structure, to thereby expose surface regions thereof on which said metallization pattern is to be formed;
    (b) exposing said mask to electromagnetic radiation so as to effectively increase the rigidity of the surface of said mask and thereby enhance the ability of said mask to resist removal during subsequent electrodeposition of metal onto said surface regions; and
    (c) immersing the structure obtained in step (b) in an electroplating solution and causing metal to be electrodeposited from said solution onto said surface regions by modulating electroplating current through the flow of which said metal is electrodeposited on said surface regions.

2. A method according to claim 1, wherein said support structure comprises a semiconductor device.

3. A method according to claim 2, wherein step (a) comprises selectively forming a layer of photoresist material patterned apertures through which expose the surface regions of said semiconductor device.

4. A method according to claim 3, wherein step (b) comprises irradiating said selectively formed layer of photoresist material with ultraviolet light.

5. A method according to claim 1, wherein step (c) comprises ON-OFF modulating said electroplating current.

6. A method according to claim 5, wherein the frequency of modulation of said electroplating current lies in a range of from 100 Hz to 1,000 Hz.

7. A method according to claim 6, wherein the duty cycle of said electroplating current lies in a range of from 5 to 25 percent.

8. A method according to claim 3, wherein said selectively formed layer of photoresist material is illuminated with ultraviolet light for a period of time as the temperature of said layer of photoresist material is brought to within a prescribed temperature.

9. A method according to claim 4, wherein step (c) comprises on-off modulating said electroplating current.

10. A method according to claim 1, wherein said structure includes a seed metal on which said metallization mask is selectively formed, said seed metal functioning as an electrode in said electroplating solution and promoting the deposition of the metal of said metallization pattern.

11. A method according to claim 10, wherein said support structure comprises a semiconductor device.

12. A method according to claim 11, wherein said metal is gold.

13. A method according to claim 11, wherein said semiconductor device comprises a silicon-containing layer on which a layer of said gold metal is formed.

14. A method according to claim 13, wherein said semiconductor device includes an adhesive film bonding said seed metal layer to said silicon-containing layer.

15. A method according to claim 14, wherein said metal is gold.

16. A method of electrodepositing a metallization pattern on a semiconductor wafer comprising the steps of:
(a) forming a layer of photoresist on said wafer and developing a prescribed metallization-defining pattern therein;
(b) toughening the photoresist layer as patterned in step (a) by exposing said photoresist layer to ultraviolet radiation, so as to effectively increase the rigidity of the surface of said photoresist layer and thereby enhance its ability to resist removal during subsequent electrodeposition of metal onto said wafer; and
(c) electrodepositing metallic interconnect lines on said wafer by pulsed plating metal onto the wafer, said lines being defined by the photoresist layer that has been toughened by exposure to ultraviolet radiation in step (b).

17. A method according to claim 16, wherein said metal is gold.

18. A method according to claim 16, wherein said pulsed plating of metal of step (c) comprises ON-OFF modulating an electrodeposition current the flow of which through an electroplating bath in which said wafer is disposed causes said metal to be deposited on said wafer in accordance with the metallization pattern defined by said layer of photoresist.

19. A metallization pattern formed on the surface of a support structure in accordance with the method of claim 1.

20. A gold interconnect pattern formed on the surface of a semiconductor wafer formed in accordance with the method of claim 18.

* * * * *